United States Patent
Labalme et al.

(10) Patent No.: US 7,632,383 B2
(45) Date of Patent: Dec. 15, 2009

(54) VACUUM SPUTTERING CATHODE

(75) Inventors: Lionel Labalme, St Just St Rambert (FR); Michel Aulagner, St Ferreol D'Auroure (FR)

(73) Assignee: Tecmachine, Andrezieux Boutheon (FR)

(*) Notice: Subject to any disclaimer, the term of this patent is extended or adjusted under 35 U.S.C. 154(b) by 0 days.

(21) Appl. No.: 11/032,430

(22) Filed: Jan. 10, 2005

(65) Prior Publication Data

US 2005/0155855 A1 Jul. 21, 2005

Related U.S. Application Data

(63) Continuation of application No. PCT/FR03/02111, filed on Jul. 8, 2003.

(51) Int. Cl.
C23C 14/34 (2006.01)
(52) U.S. Cl. .............................. 204/298.09; 204/298.12
(58) Field of Classification Search ............ 204/298.09, 204/298.12, 298.13
See application file for complete search history.

(56) References Cited

U.S. PATENT DOCUMENTS

| | | | | |
|---|---|---|---|---|
| 4,437,966 A | * | 3/1984 | Hope et al. ............ | 204/298.29 |
| 5,071,535 A | * | 12/1991 | Hartig et al. ........... | 204/298.09 |
| 5,147,521 A | | 9/1992 | Belli et al. ............. | 204/298.12 |
| 5,269,894 A | | 12/1993 | Kerschbaumer ........ | 204/192.12 |
| 5,421,978 A | * | 6/1995 | Schuhmacher et al. . | 204/298.09 |
| 5,863,397 A | | 1/1999 | Tu et al. ................ | 204/298.12 |

FOREIGN PATENT DOCUMENTS

| DE | 295 12 094 U1 | | 3/1996 |
|---|---|---|---|
| JP | 01-132758 | * | 5/1989 |
| JP | 02-205669 | * | 8/1990 |

OTHER PUBLICATIONS

Japio Abstract of 01-132758 dated May 1989.*
Derwent Abstract of 01-132758 dated May 1989.*
Japio Abstract of 02-205669 dated Aug. 1990.*

* cited by examiner

*Primary Examiner*—Rodney G McDonald
(74) *Attorney, Agent, or Firm*—Heslin Rothenberg Farley & Mesiti, P.C.; Victor A. Cardona, Esq.

(57) ABSTRACT

A vacuum sputtering cathode includes a target support having a cooler. The cathode includes a support base on which a frame is disposed. The frame defines at least one cavity for the circulation of a coolant. A membrane is disposed on top of the frame and the base, frame and membrane are assembled at the periphery of the target.

11 Claims, 7 Drawing Sheets

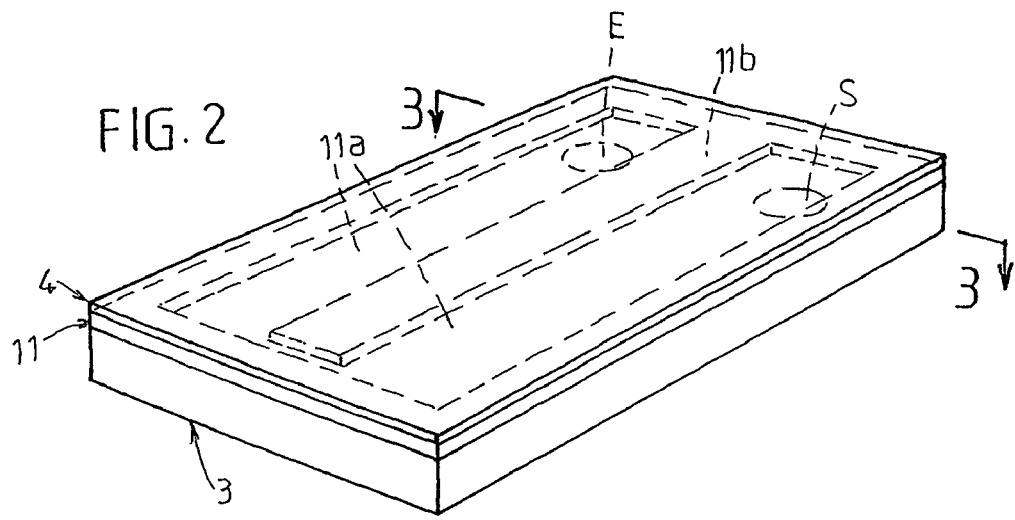
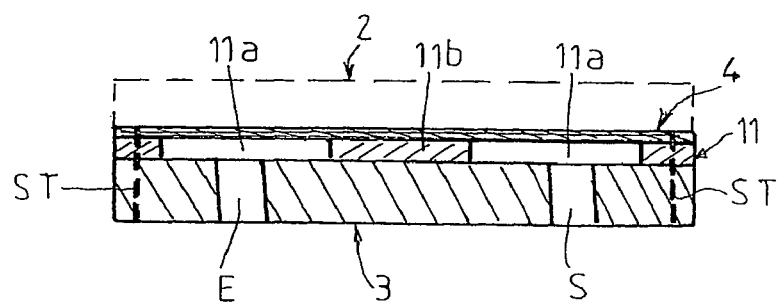
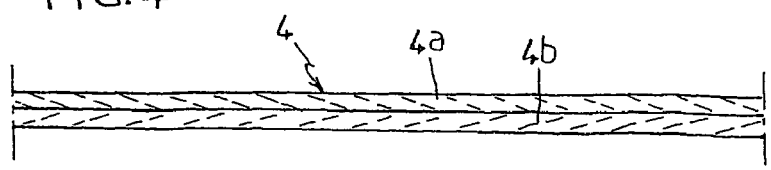

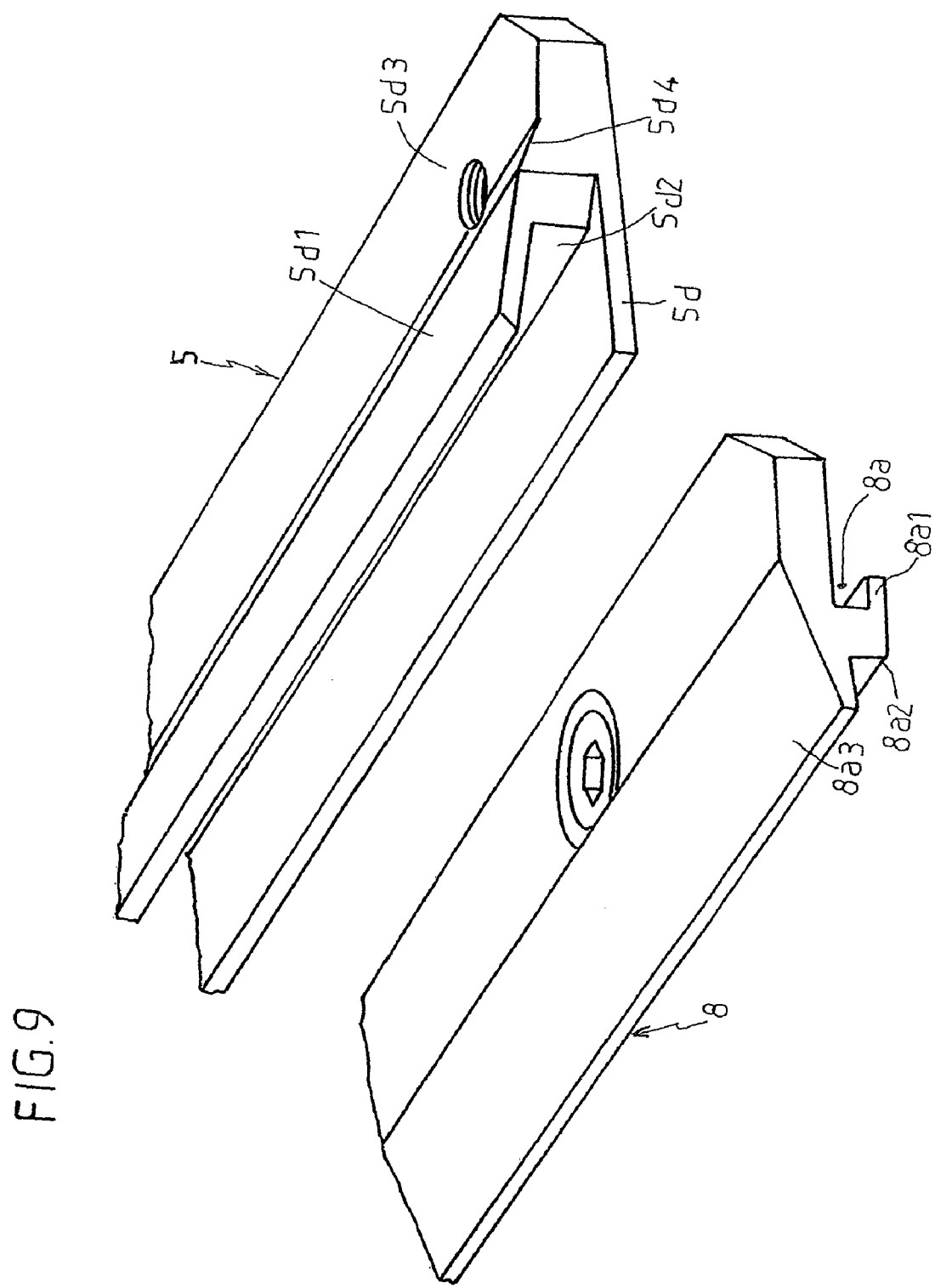

VACUUM SPUTTERING CATHODE

CROSS-REFERENCE TO RELATED APPLICATIONS

This application is a continuation of International Application PCT/FR2003/02111 filed on Jul. 8, 2003 and published in French as International Publication WO 2004/008479 on Jan. 22, 2004, and claims priority from French patent application No. 02.08869 filed Jul. 10, 2002, the entire contents of these applications being incorporated herein by reference.

The invention relates to the technical field of the sputtering of materials, particularly in a vacuum treatment plant, and more especially to cathodes intended for producing vapour.

In general, according to the prior art, a membrane cathode is in the form of a base having, in its thickness, cavities constituting ducts for the circulation of a cooling fluid. Fixed to this base, generally by means of screws, is a membrane. Facing this membrane support base is mounted, contiguously, a target for sputtering a material. In general, the membrane is made of a single material.

According to the invention, there is a desire to produce a novel type of cathode, the cooler of which has particularly advantageous properties. According to the invention, the cathode has a target support consisting of a cooler which comprises a support base on which there is superposed a frame delimiting at least one gap for the circulation of a cooling fluid, the said frame having, superposed on it, a membrane, the base, the frame and the membrane being joined together around the periphery.

Advantageously, the membrane is made up of at least two superposed materials.

Given the function that the membrane has to perform, particularly with a view to cooling and collaborating with the target, one of the materials acts as a structure and is selected to take elastic deformation while the other is selected to take plastic deformation so as to follow the surface of the sputtering target mounted in combination with the membrane.

Given the set problem of ensuring the circulation of a cooling fluid, in one embodiment, at least one of the sides of the frame has, in the same plane, at least one arm to delimit ducts for the circulation of the cooling fluid.

As stated, the invention finds a particularly advantageous application in the case of a vacuum sputtering cathode comprising a target mounted on the membrane cooler assembly.

Another problem that the invention sets out to solve is that of securing the target in a simple, reliable, effective and quick way, and of being able to change it very easily.

In effect, according to the prior art, the target securing means did not allow it to be handled and interchanged with ease. Usually, the target is fixed by means of a plurality of screws arranged around the periphery.

If one considers the very great number of screws needed to secure the target, it is obvious that the mounting and demounting time will be particularly lengthy. Furthermore, risks of seizure may arise.

It has also been proposed for the target to be secured using facial clamping, in combination with screws. This solution is still not satisfactory given that, here again, it is the screws that directly contribute to the overall clamping of the target.

To solve the set problem of securing the target quickly and effectively, therefore allowing it to be demounted and remounted quickly, so that it can be replaced, the cathode is secured to a frame delimiting a closed space for positioning and centring the target; the said frame peripherally has a profiled catching and interlocking rim able to collaborate with a set of independent gripping elements having complementary catching shapes able to allow an effect of tilting of the said elements resulting from a clamping action exerted on members engaged in the thickness of the elements, and bearing against part of the catching rim of the frame, so that, under the said tilting effect, part of the catching shapes of the set of gripping elements bears facially against the peripheral edge of the target in order to secure it.

The invention is set out in greater detail hereinafter using the figures of the attached drawings in which:

FIG. 2 is a perspective view corresponding to FIG. 1, after the various elements have been assembled;

FIG. 3 is a view in cross section taken on 3-3 of FIG. 2;

FIG. 4 is a part view, on a very large scale, showing the internal structure of the membrane as such;

FIG. 9 is a perspective part view showing the profile sections of the membrane support and of the gripping elements.

Figure 1:
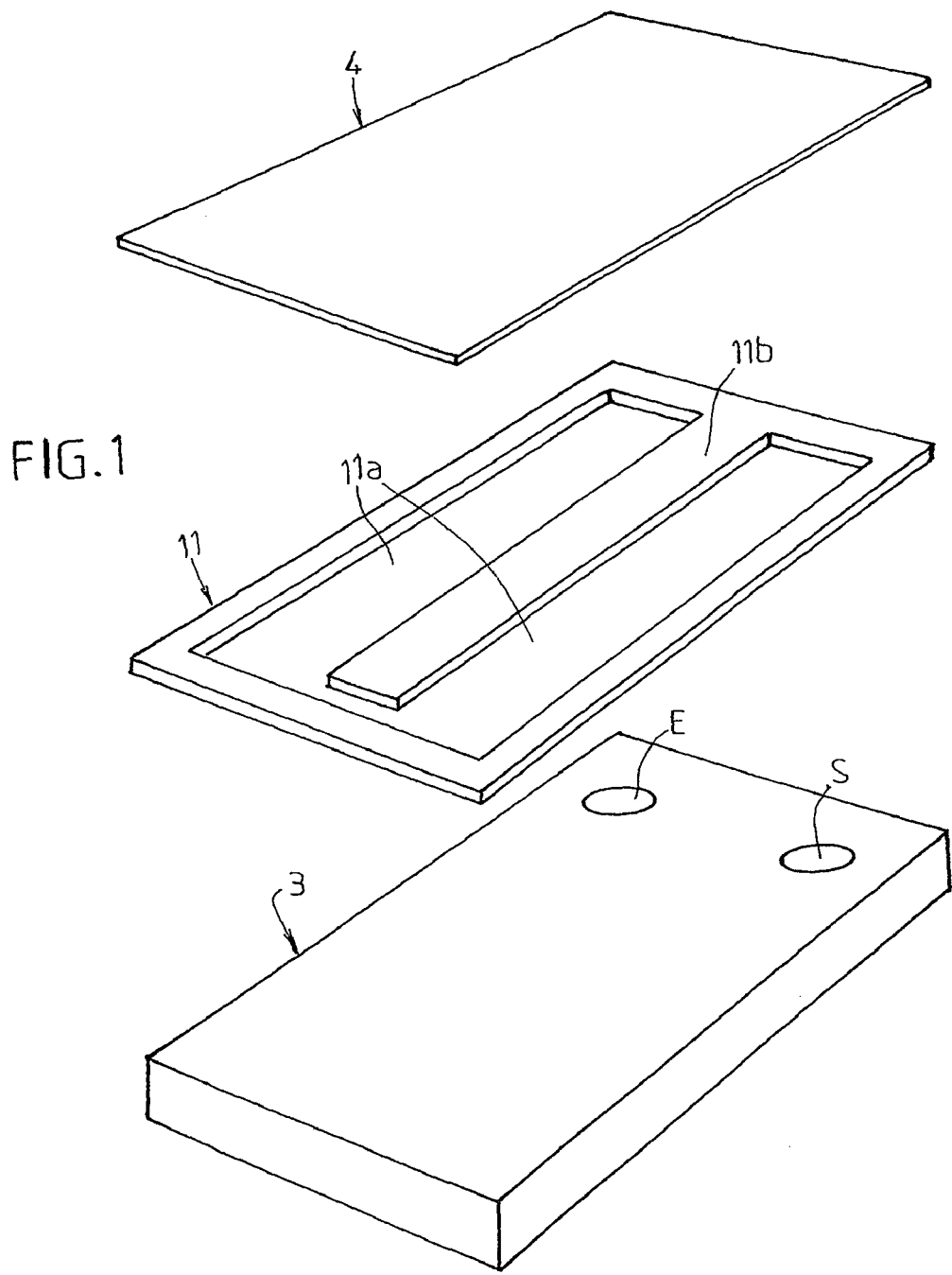
FIG. 1 is a perspective view, prior to mounting, of the main elements of the cathode according to the invention.

As FIG. 1 shows, the cathode according to the invention is made up of a support base (3) having any type of arrangement for the circulation of the cooling fluid, with an inlet (E) and an outlet (S). The base (3), for example of parallelepipedal overall shape, has, superposed on it, a plate (11) suitably cut out to form a frame delimiting at least one gap (11a) for the circulation of a cooling fluid.

At least one of the sides of the frame (11) has, in the same plane, at least one arm (11b) to delimit ducts for the circulation of the cooling fluid.

This frame (11) has, superposed on it, a membrane (4). The base (3), the frame (11) and the membrane (4) are joined together at their periphery. For example, this connection is performed using penetrating welding (ST).

According to another characteristic, the membrane (4) is made up of at least two layers (4a) and (4b) of different materials. The layer (4b), arranged on the same side as the frame (11), which acts as a structure, is made of a material selected to take elastic deformation. The other layer (4a) is made of a material selected to take plastic deformation so as to follow the surface of a sputtering target (2) (drawn in broken line in FIG. 3).

Thus, the invention finds an advantageous application in the field of vacuum sputtering by means of a target.

According to another characteristic, the assembly consisting of the support (3), of the frame (11) and of the membrane (4) is secured to a frame (5) delimiting a closed space (6) for positioning and centring the target (2). For example, when the target (2) has a rectangular overall shape, the frame (5) may be made from four straight profile sections (5A) (5B) (5C) (5D) cut and assembled to form a closed frame. The frame (5) thus produced is fixed for example using screws (7) into the thickness of the membrane support (3)-(4) and the end plate (1).

The frame (5) peripherally has a profiled catching and interlocking rim (5d) designed to collaborate with a set of gripping elements (8) having complementary catching shapes (8a).

The catching profiles (5d) and the complementary shapes (8a) are shaped in terms of cross section to allow an effect of tilting of the gripping elements (8) as a result of a clamping action exerted on members (9) engaged in the thickness of the said elements (8) and bearing on part of the catching rim of the frame (7). Under the tilting effect, part of the catching shapes (8a) of the set of gripping elements (8) bears facially against the peripheral edge of the target (2) in order to secure it as indicated below.

FIG. 9 shows an advantageous embodiment of the cross-sectional profile of the catching rim (5d) of the frame (5) and the complementary catching shapes (8a) of the gripping elements (8).

The catching and interlocking rim (5d) consists of an offset straight profile section (5d1) delimiting a straight slot (5d2). The straight profile section (5d1) is connected to a bearing face (5d3) by an inclined face (5d4).

The complementary shapes of the gripping elements (8) consist of a straight flute (8a1) designed to be engaged over the offset straight profile section (5d1) of the frame (5). The straight flute (8a1) delimits a nib (8a2) collaborating with a slot (5d2). The nib (A2) is made to project beyond an inclined bearing face (8a3) designed to collaborate with the peripheral rim of the target (2).

When the cross section of the gripping elements (8) has been fitted into the catching and interlocking profile sections of the frame (5) (engagement of the nib (8a2) in the slot (5d2) of the profile section (5d) in the flute (8a1)), all that remains to be done is for the members (9) to be operated to create the effect of tilting of the gripping elements (8). With this in mind, the members (9) consist of set screws integrated into the thickness of the elements (8), under the catching shapes (8a), and bearing on the inclined face of the connection (5d4) of the frame (5).

FIG. 3 shows the elements (8) before the set screws (9) are tightened, while FIG. 4 shows the elements (8) after the said set screws (9) have been tightened. It can be seen that after the tightening and therefore clamping action, the inclined face (8a3) bears against the peripheral edge of the target (2).

Figure 5:
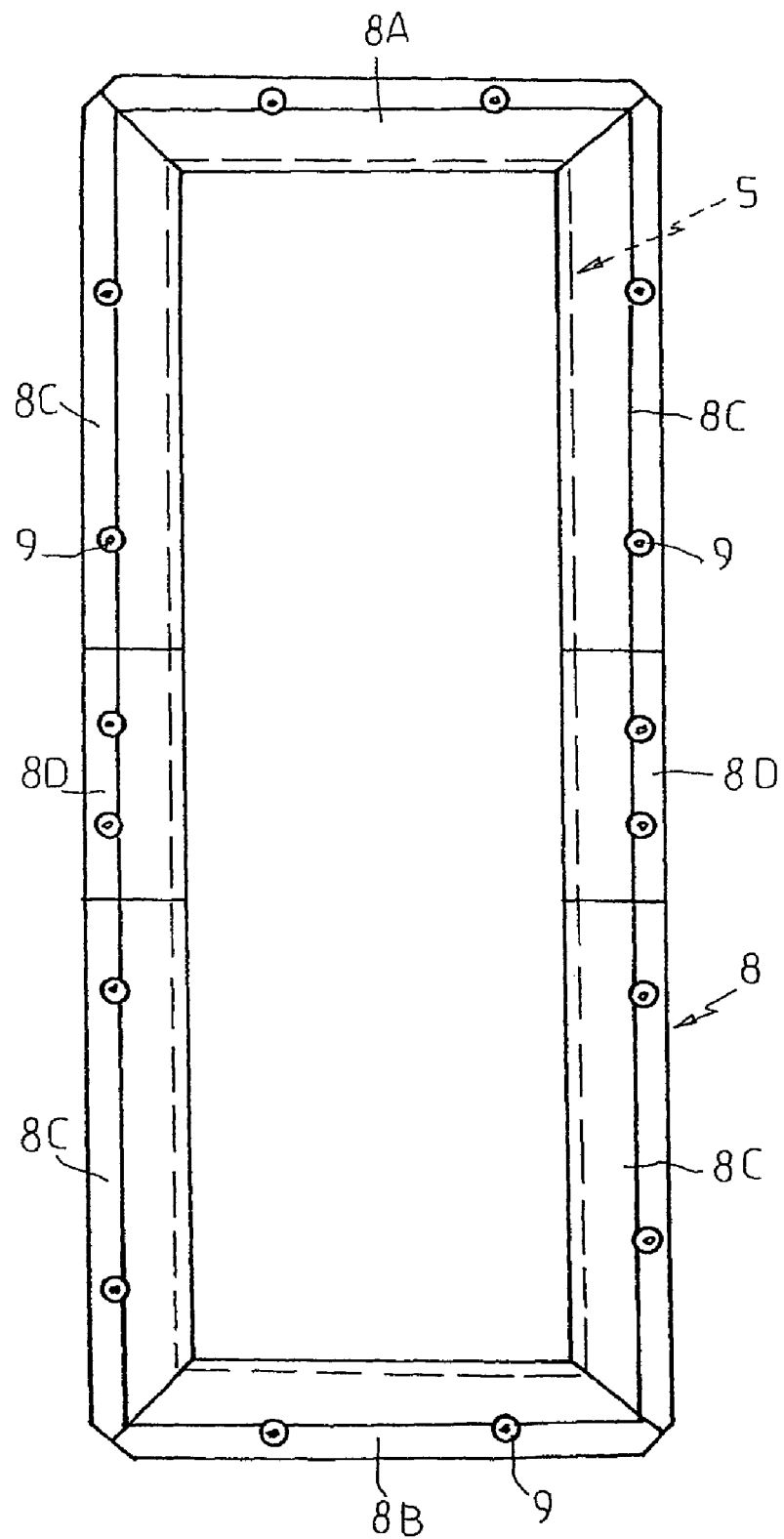
FIG. 5 is a plan view of part of a sputtering cathode, before the fitting of the gripping elements for securing the target.
Figure 6:
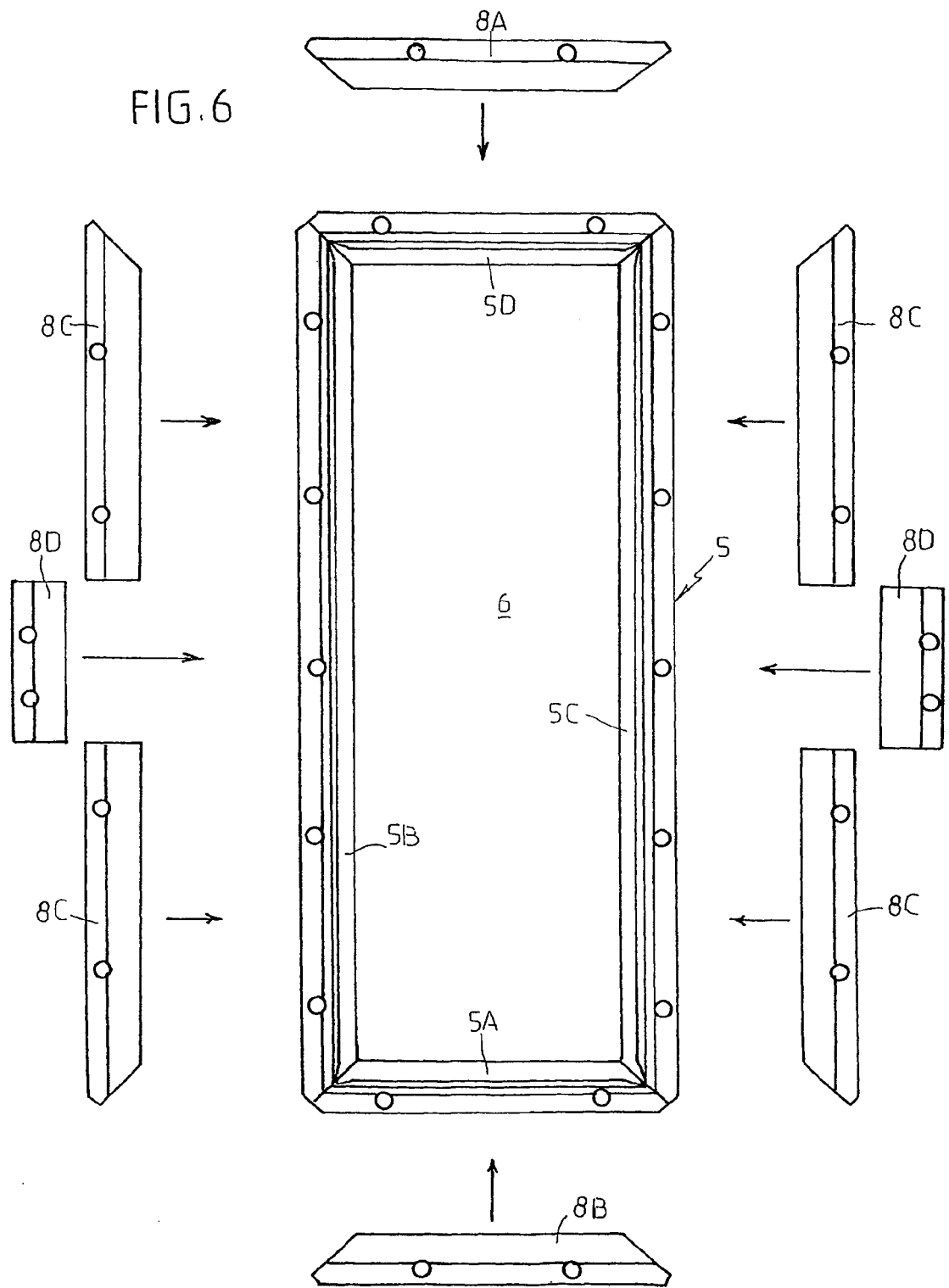
FIG. 6 is a view corresponding to FIG. 1, after the gripping elements have been fitted.
Figure 7:
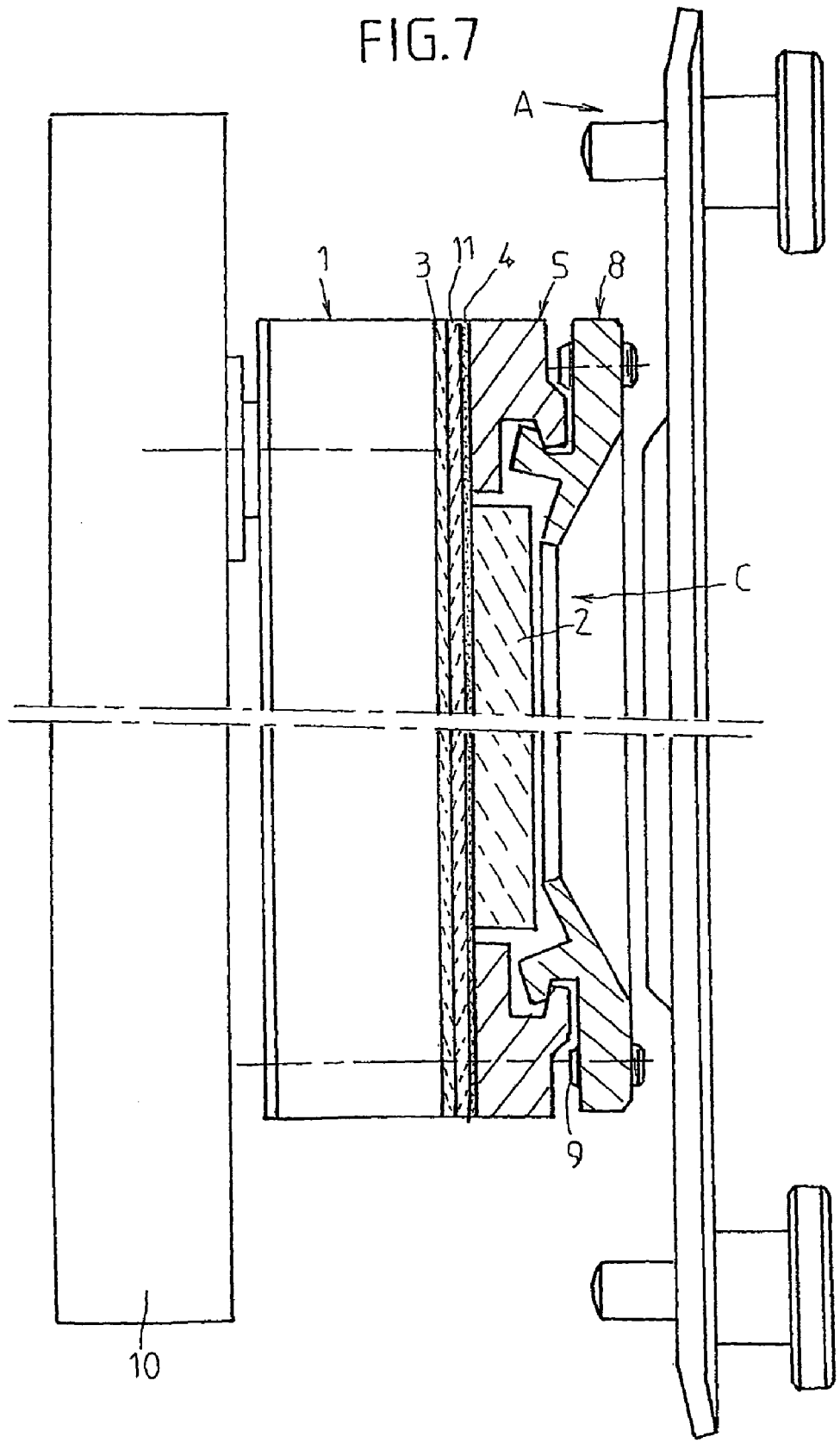
FIG. 7 is a view in section illustrating the production and application of the cathode before the clamping of the target.
Figure 8:
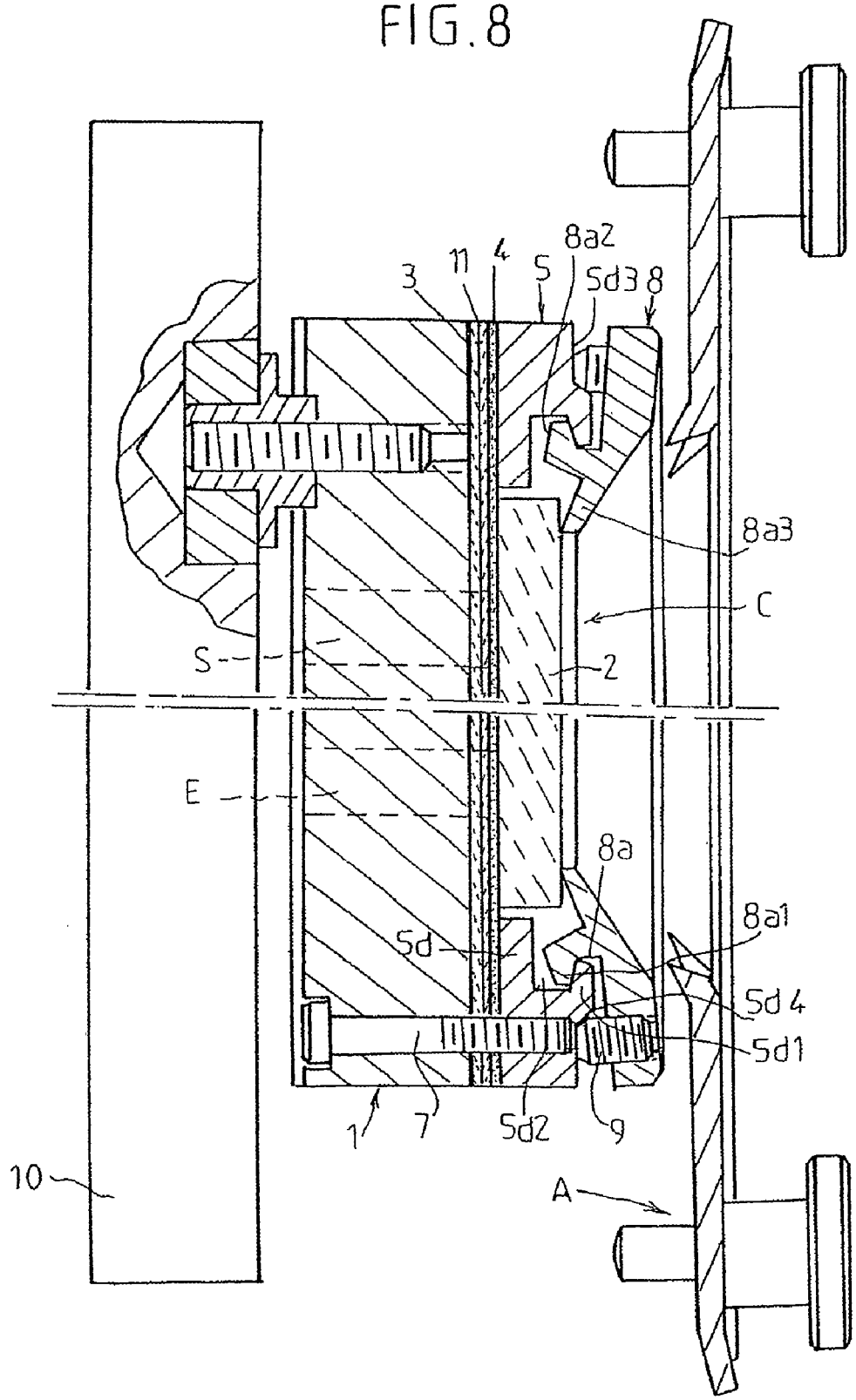
FIG. 8 is a view corresponding to FIG. 3 after the clamping of the target.

As FIGS. 5 and 6 show, the gripping elements (8) are suitably cut out to form, once they have been assembled side by side, a closed peripheral frame surrounding and completely enclosing the 4 sides of the target (2), thereby delimiting a free centred region for sputtering. In other words, after assembly, the elements (8) reproduce the same geometric shape as the frame (5).

Given the imbrication of the shapes of the catching profiles of the elements (8) and of the frame (5), the various elements (8) are independent of one another. Some have at least one mitred edge to form the corners while others are straight to be inserted by slipping between two elements in particular, these having already been positioned with respect to the frame (5).

In the example illustrated, the gripping elements (8) consist of two elements (8A) and (8B) corresponding to the two short sides of the frame, these two elements (8A) (8B) being mitred at each of their ends, of four elements (8C) mitred at one of their ends to be positioned in relation with the elements (8A) and (8B) and finally of two elements (8D) intended to be inserted after the mounting of two elements (8C) considered on the same side of the frame.

Given these arrangements, it is apparent that the mounting and demounting of the target (2) is particularly simple and quick. Indeed, all that is required is for the gripping elements (8) to be demounted by slackening the set screws (9).

Likewise, the fitting of a new target (2) can be done very quickly. Having positioned it inside the frame (7) all that remains to be done is for the gripping elements (8) to be returned to their position, as indicated, and for the set screws (9) to be tightened to cause the said elements (8) to tilt. It is therefore apparent that it is the mating profiles of the gripping elements (8) and of the frame (5) that secure the target, rather than clamping screws.

According to one important feature of the invention, the cathode assembly as defined according to the characteristics of the invention is mounted on the end plate (1), on part of the machine designed to be easily extractable. This part of the machine may advantageously consist of a door (10).

It must be noted that the gripping elements (8) may or may not be made of the same material as the sputtering target.

The advantages are clearly evident from the description.

The invention claimed is:

1. A cathode for vacuum sputtering having a support for a target of the cathode, the support comprises a cooler having a support base on which a frame is superposed, the frame delimiting at least one gap for circulation of a cooling fluid, the frame having a membrane superposed thereon, and the base, the frame and the membrane being joined together around a periphery of the target;
   wherein the membrane comprises at least two superposed materials; and
   wherein one of the two superposed materials acts as a structure and is selected to elastically deform and the other material of the superposed materials is selected to plastically deform so as to follow a surface of the sputtering target mounted in combination with the membrane.

2. The cathode according to claim 1, wherein at least one side of the frame has, in a same plane as the frame, at least one arm to delimit ducts for the circulation of the cooling fluid.

3. The cathode according to claim 1 wherein an assembly comprising the support, the frame and the membrane is secured to a frame delimiting a closed space for positioning and centering the target; the frame peripherally having a profiled catching rim configured to collaborate with a set of independent gripping elements having complementary catching shapes configured to allow an effect of tilting of the elements resulting from a clamping action exerted on members engaged in a thickness of the elements, and bearing against part of the catching rim of the frame, so that, under the tilting effect, a part of the catching shapes of the set of gripping elements bears facially against a peripheral edge of the target to secure the target.

4. The cathode according to claim 3, wherein the complementary catching shapes of the gripping elements comprise a straight flute collaborating with the offset straight profile section of the frame and delimiting a nib collaborating with the slot to give rise to the tilting effect under the clamping action.

5. The cathode of claim 1 wherein said membrane is in fluid communication with said base through said gap.

6. The cathode of claim 1 wherein said base forms a bottom of said gap, said frame forms sides of said gap and said membrane forms a top of said gap.

7. The cathode of claim 1 wherein said base comprises an inlet and an outlet for circulation of cooling fluid to said at least one gap.

8. The cathode of claim 2 wherein said at least one arm avoids connecting to said membrane.

9. The cathode of claim 1, wherein said base, said frame and said membrane are joined using penetrating welding.

10. The cathode of claim 1, wherein said base, said frame and said membrane are non-releasably joined.

11. The cathode of claim 1, wherein the one of the superposed materials comprises a first peripheral area and a central area, the other material of the superposed material comprises a second peripheral area and a second central area, and wherein the first peripheral area and the second peripheral area are joined to each other around the periphery of the target, and the first central portion and the second central portion avoid being joined to each other.

* * * * *